United States Patent [19]

Yamazaki

[11] Patent Number: 4,564,533
[45] Date of Patent: Jan. 14, 1986

[54] METHOD FOR DEPOSITING SILICON CARBIDE NON-SINGLE CRYSTAL SEMICONDUCTOR FILMS

[75] Inventor: Shunpei Yamazaki, Tokyo, Japan

[73] Assignee: Semiconductor Energy Laboratory Co., Ltd., Tokyo, Japan

[21] Appl. No.: 693,296

[22] Filed: Jan. 22, 1985

[30] Foreign Application Priority Data

Jan. 23, 1984 [JP] Japan .................................. 59-9865

[51] Int. Cl.$^4$ ............................................. B05D 3/06
[52] U.S. Cl. .................................... 427/39; 427/53.1; 427/54.1
[58] Field of Search ........................ 427/39, 53.1, 54.1

Primary Examiner—Bernard D. Pianalto
Attorney, Agent, or Firm—Murray, Whisenhunt and Ferguson

[57] ABSTRACT

A method of forming a silicon carbide non-single crystal semiconductor, characterized in that said method comprises the step of: applying electric or light energy to a methylsilane expressed by the formula of $SiH_{4-n}(CH_3)_n$ (where n=1 to 3) or $Si_2(CH_3)_nH_{6-n}$ (where n=1 to 5) and a silane hydride (of $Si_mH_{2m+2}$, where m=1 to 3), thereby forming a silicon carbide non-single crystal semiconductor film layer containing $Si_xC_{1-x}$ (where $0<x<1$) as a major component thereof.

13 Claims, 5 Drawing Figures

METHOD FOR DEPOSITING SILICON CARBIDE NON-SINGLE CRYSTAL SEMICONDUCTOR FILMS

BACKGROUND OF THE INVENTION

1. Field of the Invention

This invention relates to a method for producing a non-single crystal silicon carbide semiconductor, and more particularly to a method for depositing a film of non-single crystal silicon carbide semiconductor containing a multitude of Si—C bonds, using a reduced amount of electric or light energy for the formation of the film.

SUMMARY OF THE INVENTION

According to a fundamental aspect of the present invention, there is provided a method of forming a silicon carbide non-single crystal semiconductor film layer, the method being characterized by the step of applying electric or light energy to a reaction gas mixture containing a methylsilane expressed by the formula of $SiH_{4-n}(CH_3)_n$ (where n=1 to 3) or the formula of $Si_2(CH_3)_nH_{6-n}$ (where n=1 to 5) and a silane hydride (of $Si_mH_{2m+2}$, where m=1 to 3), thereby forming a silicon carbide non-single crystal semiconductor film layer containing $Si_xC_{1-x}$ (where $0<x<1$) as a major component thereof.

According to another aspect of the invention, the method comprises applying electric or light energy to a methylsilane expressed by the formula of $SiH_{4-n}(CH_3)_n$ (where n=1 to 3) or $Si_2(CH_3)_nH_{6-n}$ (where n=1 to 5) and a silicon fluoride (of $H_mSiF_n$ where m=0 to 1 and n=1 to 4), thereby forming a silicon $Si_xC_{1-x}$ (where $0<x<1$) as a major component thereof.

OBJECTS OF THE INVENTION

It is an object of the present invention to provide a method of forming a p-type non-single crystal silicon carbide semiconductor (of $Si_xC_{1-x}$ where $0<x<1$) on and in intimate contact with a conductive transparent film (hereinafter referred to simply as "CTF" for brevity) on the light incident side of a semiconductor device, especially of a photo-voltaic converter (hereinafter referred to simply as "PVC" for brevity).

It is another object of the invention to produce such a p-type silicon carbide semiconductor by introducing into a reaction system a reaction gas mixture consisting of a methyl silane expressed by $SiH_{4-n}(CH_3)_n$ (where n=1 to 3) or $Si_2(CH_3)_nH_{6-n}$ (where n=1 to 5) (hereinafter referred to simply as "methyl silane" or "MS" for brevity), a silane (of $Si_mH_{2m+2}$, where m=1 to 3), and diborane ($B_2H_6$) without using hydrogen or an inert carrier gas.

It is a further object of the invention to produce the p-type silicon carbide semiconductor by introducing into a reaction system a reaction gas mixture consisting of a methyl silane expressed by $SiH_{4-n}(CH_3)_n$ (n=1 to 3) or $Si_2(CH_3)_nH_{6-n}$ (n=1 to 5) and a silicon fluoride ($H_mSiF_n$ where m=1 to 3 and n=1 to 4) such as $SiF_2$, $SiF_4$, $H_2SiF_2$, $H_3SiF$, $HSiF_3$ or $SiF_3$ (i.e., $Si_2F_6$).

It is still another object of the invention to provide a method of forming, on a transparent insulating substrate, a double-layer conductive transparent film consisting of a first conductive transparent layer with a textured surface composed mainly of indium oxide and a second conductive transparent layer composed mainly of tin oxide, and then forming thereon a p-type silicon carbide (of $Si_xC_{1-x}$ where $0<x<1$) having an electro-conductivity of $1\times10^{-4}$ to $1\times10^{-6}$ $(\Omega cm)^{-1}$ and an optical energy band gap greater than 2.05 eV, preferably greater than 2.1 eV, thereby producing from silicon carbide a non-single crystal semiconductor having at least one PIN junction suitable for application as PVC.

PARTICULAR DESCRIPTION OF THE INVENTION

According to the present invention, a p-type semiconductor of $Si_xC_{1-x}$ (where $0<x<1$) is formed in intimate contact with an underlying CTF as mentioned hereinbefore, by the use of a reaction gas mixture containing a methyl silane which has both Si—H and Si—C bonds, except tetramethylsilane. The methyl silane which is useful in the present invention is expressed by the general formula of $SiH_{4-n}(CH_3)_n$ (where n=1 to 3) or $Si_2(CH_3)_nH_{6-n}$ (where n=1 to 5), and its typical examples include $H_3Si(CH_3)$, $H_2Si(CH_3)_2$, $HSi(CH_3)_3$ and the like.

In the following description of the invention, a reaction gas mixture containing as a methylsilane $SiH_2(CH_3)_2$, dimethylsilane (hereinafter referred to simply as "DMS" for brevity), and diborane ($B_2H_6$) diluted with silane ($Si_mH_{2m+2}$ where m=1 to 3) is used by way of example.

This DMS ($CH_3SiH_2CH_3$) has a molecular weight of 60 and a boiling point of $-19.6°$ C., and is characterized by that it has Si—C bonds in the molecular form without a cluster of Si or C alone.

Further, DMS contains Si—H bonds in its molecules so that, by reaction with diborane with B—H bonds, it can form Si—B bonds suitable for a p-type semiconductor, as a coupler in positions adjacent to Si—C bonds. This is an extremely great advantage over the conventional TMS ($Si(CH_3)_4$) has Si—C bonds but it is incapable of bonding B for the valence electron control due to absence of Si—H bonds.

In addition, DMS has a large molecular weight and is different in molecular structure from methane ($CH_4$) which has a symmetric structure, so that C and Si radicals can be easily produced by freeing H from C—H and Si—H bonds without applying strong electric energy as required in the case of $CH_4$.

There is another advantage that, due to the presence of Si—C bonds which are possessed from the start and the absence of C—C bonds, it is possible to secure a high C concentration in the film of the reaction product by a high-frequency output of low level.

Accordingly, CTF which underlies $Si_xC_{1-x}$ ($0<x<1$) is free of damages (sputtering) during the film forming process, and the oxygen content of CTF is prevented from intruding the semiconductor, thereby precluding degradations in characteristics due to photo-induced effect to guarantee high reliability.

Where $SiF_2$ or $Si_2F_6$ is used as a silicon fluoride, the reaction product includes HF in addition to $Si_xC_{1-x}$ ($0<x<1$), and hydrogen or fluorine is mixed into $Si_xC_{1-x}$ as a neutralizer of the re-combination center.

Figure 1:
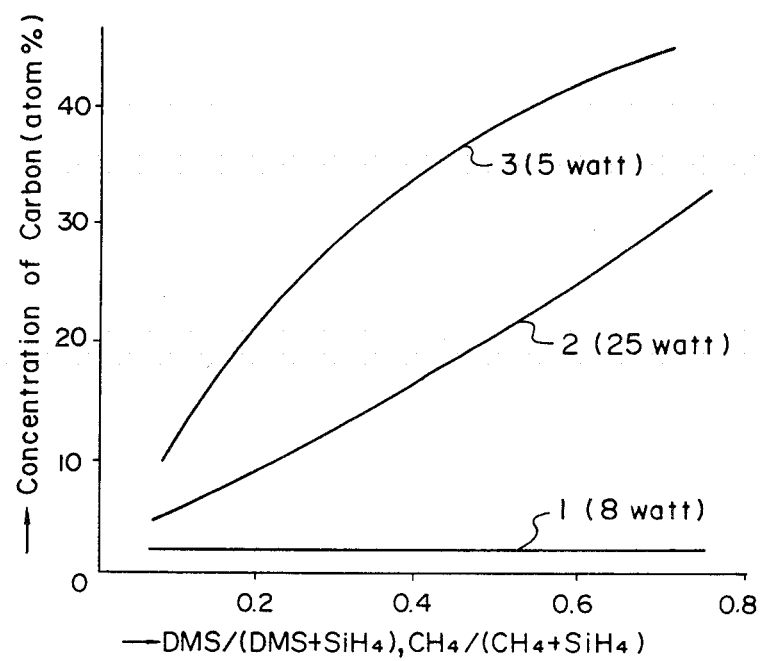
FIG. 1 is a graph showing characteristics of non-single crystal semiconductor film layers formed by the method of the invention and a conventional method.

Shown in FIG. 1 are characteristics of $Si_xC_{1-x}$ ($0<x<1$) films which were produced by means of the apparatus as disclosed in Applicant's copending applications directed to "Apparatus for Plasma Chemical Vapor Deposition", namely, in Japanese Patent Application Nos. 57-163729 and 163728 (filed on Sept. 20, 1982) and Patent Application Nos. 57-167280 and 167281 (filed on Sept. 27, 1982. These four Japanese applications correspond to U.S. patent application Ser. No. 533,941.

More specifically, the films were deposited by holding four substrate sheets of 100 cm$^2$ (10 cm × 10 cm) in upright positions at intervals of 6 cm and closing a positive column of glow discharge cylindrically in a discharge space having an inter-electrode distance of 15 cm and an electrode area of 15 cm$\phi$. The reaction gas was fed from the top to bottom of a reaction chamber with electrodes in upper and lower portions thereof.

In FIG. 1, curves 1 and 2 indicate the concentrations of C in the semiconductors produced by the use of conventional $CH_4$. It will be seen therefrom that, under the conditions where the temperature is 210° C. and the high-frequency output (13.56 MHz) is 1 Torr (with an electrode diameter of 150 mm$\phi$), the concentration of C in the film cannot be increased even if the amount of methane is augmented. The carbon concentration is increased at the output level of 25 W as indicated by curve 2, but there occurs the problem of sputtering in the underlying layer.

However, it is possible to secure a sufficient high carbon concentration at an output as low as 5 W by the method of the present invention as indicated by curve 3 (employing the same conditions in other respects as curves 1 and 2). As a result, a greater optical energy band gap can be expected. This is because DMS itself initially possesses Si—C bonds.

The output which is as low as 5 W can effectively suppress the damages by sputtering of the tip end portions (or distal end portions) of the textured surface of CTF at which its electric line of force tends to be concentrated. In other words, the oxygen which constitutes CTF less mingles into $Si_xC_{1-x}$ ($0<x<1$) on CTF, and there is no possibility of CTF losing transparency due to sputtering.

Figure 2:
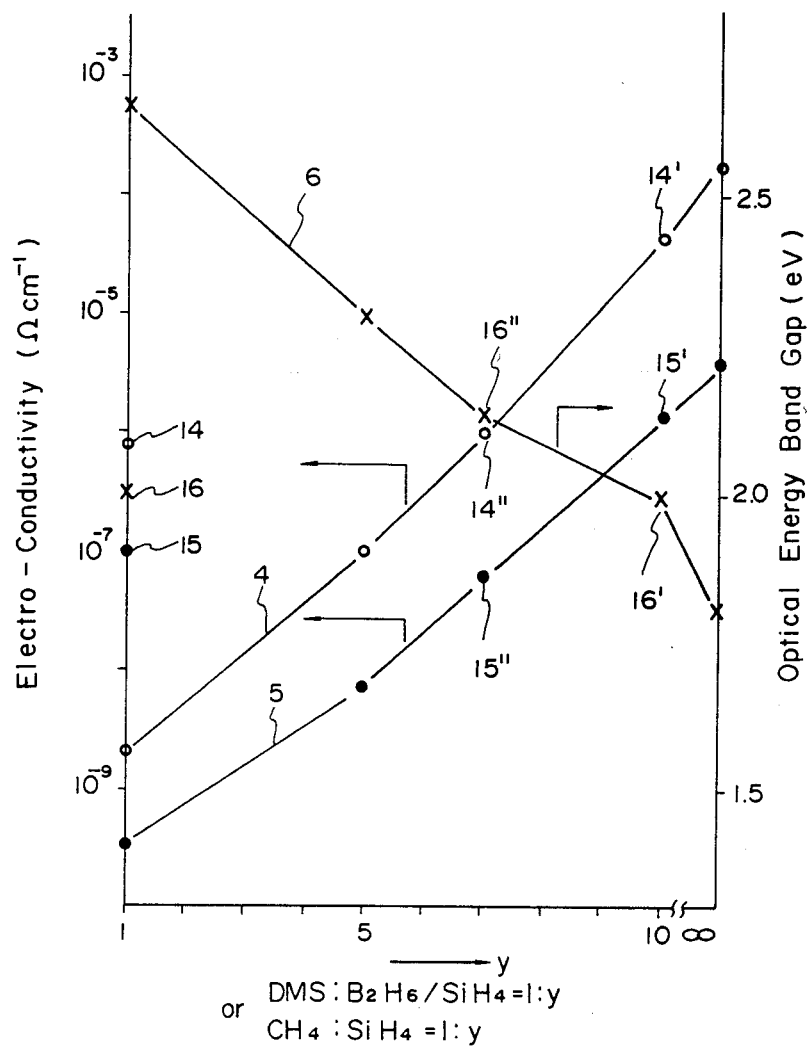
FIG. 2 is a graph showing characteristics in optical energy band gap and electro-conductivity, obtained by the use of a methylsilane according to the method of the invention.

Plotted in FIG. 2 is the values of optical energy band gap Eg (indicated at 6) and electro-conductivities $\sigma_p$ (indicated at 4) and $\sigma_d$ (indicated at 5) in those cases which employed the same conditions as curve 3 of FIG. 1 except that DMS and a silane mixture (consisting of 99.65% of silane ($SiH_4$) and 0.35% of $B_2H_6$) were used in a ratio of 1:y, taking the amount of the silane mixture (y) on the abscissa.

The electro-conductivity was measured by the use of co-planar type electrodes (with an interelectrode distance of 1 mm and a width of 5 mm) and irradiating light at an intensity of AM1 (100 mW/cm$^2$).

Also shown in FIG. 2 are the values of Eg (16), $\sigma_p$ (14) and $\sigma_d$ (15) in a comparison example where $B_2H_6/SiH_4 = 0.5\%$ and $CH_4:SiH_4 = 1:1$ (conditions in other respects were same as curve 2 of FIG. 1).

As clear therefrom, y=10 in order to obtain an Eg value which was equivalent to Eg (16) by methane, and the value of $\sigma_p$ (14') by a method using methylsilane according to the invention was $4 \times 10^{-5}$ ($\Omega$cm)$^{-1}$, which was 50 times greater than $8 \times 10^{-7}$ ($\Omega$cm)$^{-1}$ of $\sigma_p$ (14). The value of $\sigma_d$ (15') was $1.5 \times 10^{-6}$ ($\Omega$cm)$^{-1}$ which was 15 times greater than $1 \times 10^{-7}$ ($\Omega$cm)$^{-1}$ of $\sigma_d$ (15) by methane.

On the other hand, y=7 in order to obtain a $\sigma_p$ value which was comparable to $\sigma_p$(14) of methane by the use of DMS. In this instance, Eg (16") was 2.15 eV which was greater than 2.0 eV of methane by as much as 0.15 eV.

It should also be noted that, in the case of FIG. 2, the high-frequency output is 5 W, that is to say, only 1/5 as compared with methane which requires 25 W.

Figure 3A:
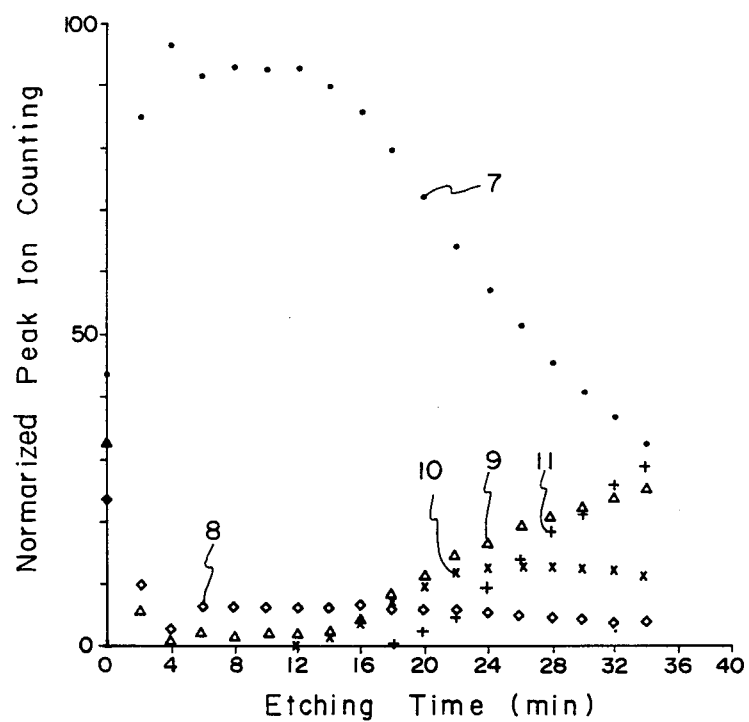
FIGS. 3(A) and 3(B) are graphs showing depth profiles of the semiconductors produced according to the invention using a methylsilane and the conventional method using methane, respectively.

Plotted in FIG. 3 are the effects of DMS which were examined by Auger spectrum analysis, showing the depth profile of a silicon carbide non-single crystal conductor of 400 Å formed on CTF, which was formed by depositing $SnO_2$ in a thickness of 200 Å on a 1000 Å thick ITO (indium tin oxide) substrate, under the conditions of DMS:$B_2H_6/SiH_4 = 1:10$ and a high-frequency output of 5 W and 0.1 Torr.

Examination of the depth profile revealed adsorption of $CO_2$ and the like on the surface (Y-axis at the left end) and production of $SiO_2$ due to spontaneous oxidation. By etching of 12 minutes, tin (10) and oxygen (9) were observed, both in increasing amounts. Indium was observed at an etching time of 18 minutes. This means that tin oxide was laminated on ITO. It is also seen that $Si_xC_{1-x}$ was laminated on CTF according to the ratio of C to Si (Si:C=92:6 and thus x=0.94 in this instance).

The data also showed that mixing of these constituents did not take place.

However, as shown in FIG. 3, when the silicon carbide non-single crystal semiconductor film was formed under the conditions of $CH_4:SiH_4 = 1:1$, a high-frequency output of 25 W and a reaction pressure of 0.1 Torr, a large quantity of oxygen was sputtered into $Si_xC_{1-x}$ in the boundary regions of CTF and $Si_xC_{1-x}$ (an intermixed region of Si (7) and C (8)), released (or mixing) into a region 12. Both tin (10) and indium (11) appeared on CTF at the etching time of 25 minutes, indicating that tin and indium were mixed completely at the interface.

Namely, by using a methylsilane according to the invention, it becomes possible to introduce a large quantity of C into the silicon carbide non-single crystal semiconductor even with a high-frequency discharge of low energy level, and thus to secure a larger value of Eg.

Figure 3B:
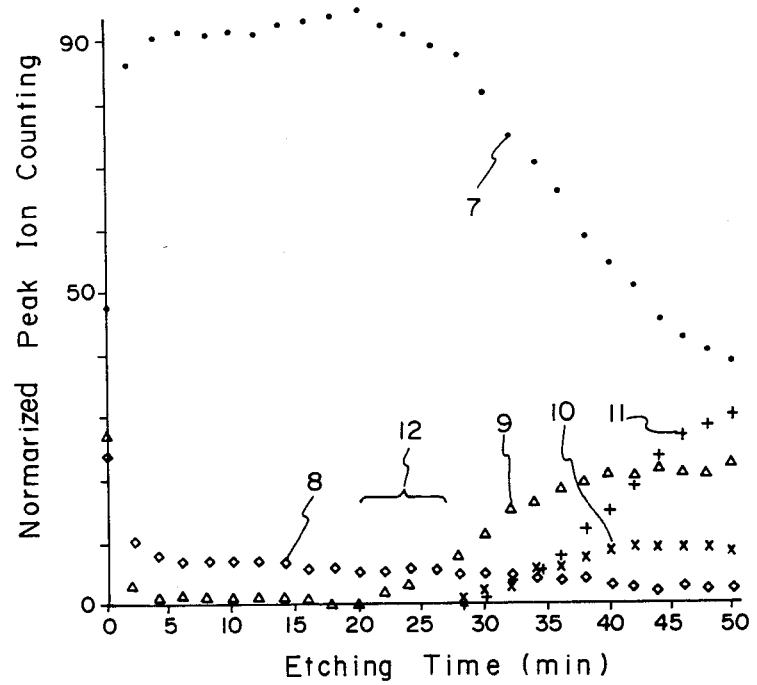

Consequently, I have reached the significant fact that it is possible to avoid formation of a mixed layer at the boundaries of tin and indium layers of CTF as in FIG. 3(B), while preventing oxygen of CTF from mixing into $Si_xC_{1-x}$ on the tin oxide layer which is as thin as 200 Å.

Figure 4:
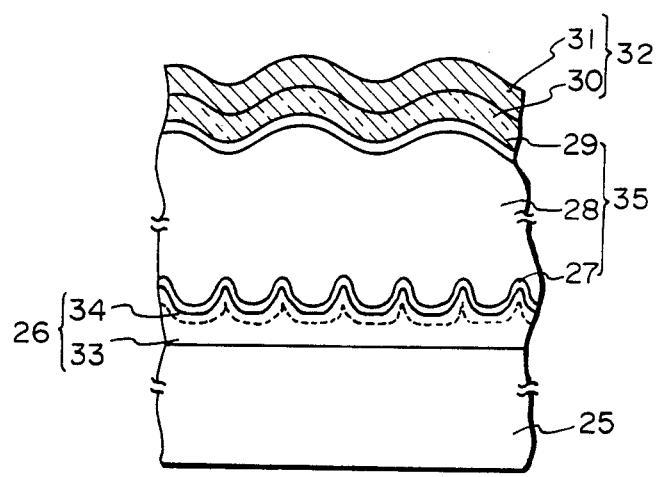
FIG. 4 is a diagrammatic cross section of a photo-voltaic converter produced by the method of the invention.

In the following description, the method of the present invention is discussed in a more developed form, applying it to a manufacture of a photo-voltaic converter of the construction as shown in FIG. 4.

Namely, an ITO layer 33 of a thickness of 500 to 3000 Å, preferably of a mean thickness of 1500 to 2000 Å, for example, of a mean thickness of 1600 Å (with surface variations of 500 to 700 Å in height and at a pitch of 1000 to 3000 Å) was formed, and then an SnO$_2$ layer 34 having a thickness of 100 to 1000 Å, preferably a mean thickness of 400 to 550 Å, for example, a mean thickness of 500 Å was laminated thereon.

Further, the textured surface of the SnO$_2$ (34) was covered with an intimately contacting layer of a p-type semiconductor of Si$_x$C$_{1-x}$ (0<x<1) by the use of a non-single crystal semiconductor according to the method shown in FIGS. 1 and 2. Thereafter, I-type and N-type layers 28 and 29 were formed to obtain a semiconductor 35 with at least one PIN junction.

More specifically, a p-type Si$_x$C$_{1-x}$ layer 27 (x=0.8) of a thickness of about 100 Å (or about 200 Å in flat state), an I-type Si semiconductor 28 of a thickness of about 7000 Å and an N-type fine crystal semiconductor or an N-type silicon carbide non-single crystal semiconductor 28 of a thickness of about 7000 Å were formed by a PCVD (plasma chemical vapor deposition) process using a multi-chamber system with independent reaction chambers for the respective layers.

In this instance, since infusion from CTF could be prevented and due to suppression of leaks from outside and desensitization of reactive gases in the reactor, the oxygen concentration in the semiconductor could be held below 1×10$^{19}$ cm$^{-3}$, preferably below 5×10$^{18}$ cm$^{-3}$ with respect to the first layer 28. Rather than an amorphous structure, this I-type semiconductor layer was desired to be semi-amorphous structure in terms of the crystallographical structure, namely, a structure partly possessing crystalline properties or regularity in view of improved electric characteristics including a higher mobility of holes and electrons.

Besides, it was desired to hold the oxygen concentration in p-type Si$_x$C$_{1-x}$ (0<x<1) semiconductor 27 below 5×10$^{19}$ cm$^{-3}$ for improving the electric conductivity by reducing the amount of oxygen intruding from CTF.

Further, a back-side electrode 33 was formed thereon. More specifically, an ITO layer 30 with a flat surface was formed in a mean film thickness of about 1050 Å at 100° to 250° C., for example, at 150° C. by the electron beam method, and a reflective electrode 31 was formed in a thickness of 500 to 3000 Å, for example, in a thickness of 2000 Å by vacuum vapor deposition using silver or aluminum.

The photo-voltaic conversion efficiency of an area of 3 mm×3.5 mm (1.05 cm$^2$) was 10.50% at AM1 (100 mW/cm$^2$) (10).

Namely, the p-type semiconductor layer 27 formed by the use of methylsilane and silane hydride or by methylsilane and silane fluoride according to the invention, with Si$_x$C$_{1-x}$ where 0<x<1, for example, x=0.8 to 0.9, has a larger value of Eg than Si and an electro-conductivity higher than 3×10$^{-7}$ (Ωcm)$^{-1}$, namely, electro-conductivity of 1×10$^{-4}$ to 3×10$^{-7}$ (Ωcm)$^{-1}$, guaranteeing higher Eg and electro-conductivity as compared to the silicon carbide produced from silane and methane.

The invention is illustrated more particularly by the following examples.

EXAMPLE 1

FIG. 4 shows the semiconductor device of the invention in a fragmentary cross section.

As shown in FIG. 4, an ITO layer was deposited by an electron beam deposition method at a temperature of 400° C. and in a mean thickness of 1500 Å on transparent glass 25 (of a thickness of 1.1 mm) with ART (anti-reflection treatment). After sintering ITO, tin oxide was deposited thereon at a temperature of 200° C. in a mean thickness of 500 Å by the plasma chemical vapor deposition or sputtering method.

This CTF sheet 26 with the double-layer construction had a resistance of 35 Ω/cm$^2$.

Thereafter, in order to form a p-type semiconductor 27 of Si$_x$C$_{1-x}$ (0<x<1) by a multi-chamber type PCVD method, the reaction gases, namely, silane added with diborane and DMS were fed to the reactor at the rates of 14 cc/min and 2 cc/min (DMS:SiH$_4$=1:7, B$_2$H$_6$/SiH$_4$=0.35%), respectively, without using a carrier gas like hydrogen. The semiconductor film was deposited in a thickness of about 200 Å on the substrate in the reactor with a substrate temperature of 210° C., a reaction pressure of 0.1 Torr and a high-frequency of 13.56 MHz at 5 W.

The resulting film had Si$_x$C$_{1-x}$ where x=0.8, an optical energy band gap of 2.15 eV, $\sigma_d$=6×10$^{-8}$ (Ωcm)$^{-1}$ and $\theta_{ph}$=1×10$^{-6}$ (Ωcm)$^{-1}$.

In this instance, the electric energy was so applied as to direct its line of force in the direction parallel with the substrate surface to prevent sputtering of CTF and other forming surfaces by reaction products.

Subsequent to formation of the p-type semiconductor layer, the substrate was transferred into a succeeding reaction chamber, in which a semiconductor layer 28 was formed, feeding 100% silane at the rate of 20 cc/min under the conditions of 210° C. and 0.1 Torr.

At this time, boron was added (including auto doping) in a gradually decreasing amount from 1×10$^{17}$ cm$^{-3}$ thereby to improve the hole mobility. The oxygen concentration in the Si semiconductor layer was smaller than 5×10$^{18}$ cm$^{-3}$ and it was 3×10$^{18}$ cm$^{-3}$ according to SIMS data.

Thus, the I-type semiconductor layer 28 was formed in thickness about 0.7 micron.

An N-type non-single crystal semiconductor layer 29 was formed with SiH$_4$ and H$_2$ feed rates of 5 cc/min and 100 cc/min, respectively, a substrate temperature of 210° C. and a high-frequency (13.56 MHz) output of 10 W. The resulting layer had $\sigma$=1 to 30 (Ωcm)$^{-1}$. It was revealed that the crystal had a size of 93 Å, a value led from the results of the results of laser-raman spectral analysis by Sieler's formula.

Formed further thereon was a 50 Å thick layer of Si$_x$C$_{1-x}$ of x=0.9 with DMS:PH$_3$/SiH$_4$=1:6 and PH$_3$/SiH$_4$=1%. A second electrode 32 consisting of ITO(30) of 1050 Å and silver (31) of 2000 Å was formed by electron beam deposition.

The maximum conversion efficiency of PVC thus obtained is given below in comparison with the conventional counterpart.

|  | Conventional | Invention |
|---|---|---|
| Open Circuit Voltage V$_{oc}$ (V) | 0.81 | 0.83 |
| Short Circuit Voltage I$_{sc}$ (mA/cm$^2$) | 14.3 | 18.5 |
| Fill Factor (%) | 57 | 68 |
| Conversion Efficiency (%) | 6.2 | 10.5 |

The foregoing data are the results of measurement of an area of 3 mm×3.5 mm (1.05 cm$^2$) irradiated with AM1 (100 mW/cm$^2$) at room temperature.

As seen therefrom, the method of the resent invention excels the conventional method by 3.9%, attaining a conversion efficiency higher than 10% which has an extremely great advantage from an industrial point of view.

It will be appreciated from the foregoing results that the method of the present invention can improve the photo-voltaic conversion efficiency by almost 30% as compared with the conventional method, and can be advantageously applied to mass production.

Although the invention has been described mainly by way of methylsilane and DMS, it is also possible to use monomethyl silane ($H_3Si(CH_3)$) and silane. By way of example, the PCVD method has been mainly shown as a method for forming the silicon carbide film layer. However, it is also feasible to form the silicon carbide non-single crystal semiconductor from methylsilane and disilane ($Si_2H_4$) or silicon fluoride ($Si_2F_6$) by a photochemical vapor deposition method using an ultraviolet ray of a wavelength smaller than 300 nm. For such photo chemical vapor deposition, an Excimer laser or a low-pressure mercury discharge tube is effective.

What is claimed is:

1. A method of forming a silicon carbide non-single crystal semiconductor, characterized in that said method comprises the step of:
   applying electric or light energy to a methylsilane expressed by the formula of $SiH_{4-n}(CH_3)_n$ (where n=1 to 3) or $Si_2(CH_3)_nH_{6-n}$ (where n=1 to 5) and a silane hydride (of $Si_mH_{2m+2}$, where m=1 to 3);
   thereby forming a silicon carbide non-singe crystal semi-conductor layer containing $Si_xC_{1-x}$ (where $0<x<1$) as a major component thereof.

2. A method of forming a silicon carbide non-single crystal semiconductor, characterized in that said method comprises the step of:
   applying electric or light energy to a methylsilane expressed by the formula of $SiH_{4-n}(CH_3)_n$ (where n=1 to 3) or $Si_2(CH_3)_nH_{6-n}$ (where n=1 to 5) and a silicon fluoride (of $H_mSiF_n$ where m=0 to 3 and n=1 to 4);
   thereby forming a silicon carbide non-singe crystal semi-conductor layer containing $Si_xC_{1-x}$ (where $0<x<1$) as a major component thereof.

3. The method of claim 1, comprising adding diborane to said methylsilane and silane hydride to form a p-type silicon carbide non-single crystal semiconductor containing $Si_xC_{1-x}$ as a major component thereof.

4. The method of claim 2, comprising adding diborane or phosphine to said methylsilane and silicon fluoride to form a p- or n-type silicon carbide non-single crystal semiconductor.

5. The method of claim 3, comprising forming, on a conductive transparent film on a substrate, a hydrogen-containing p-type non-single crystal semiconductor with C/Si=0.01 to 0.5 and an electro-conductivity higher than $1 \times 10^{-6}$ $(\Omega cm)^{-1}$.

6. The method of claim 4, comprising forming a hydrogen- or fluorine-containing p- or n-type silicon carbide non-single crystal semiconductor with S/Si=0.01 to 0.5 and an electro-conductivity higher than $1 \times 10^{-6}$ $(\Omega cm)^{-1}$.

7. The method of claim 1 or 2, wherein said methylsilane is $SiH_2(CH_3)_2$ or $SiH_3CH_3$.

8. The method of claim 1, wherein said silane hydride is $SiH_4$ or $Si_2H_6$.

9. The method of claim 2, wherein said silicon fluoride is $SiF_2$ or $Si_2F_6$.

10. The method of claim 1 or 2, wherein said electric energy is applied by plasma CVD using glow discharge.

11. The method of claim 1 or 2, wherein said light energy is applied by irradiation of an ultraviolet ray of a wavelength smaller than 300 nm or an Excimer laser beam.

12. A p-type non-single crystal semiconductor produced by the method of claim 3, for use in the manufacture of a photo-voltaic converter having a PIN junction.

13. A p- or n-type non-single crystal semiconductor produced by the method of claim 4, for use in the manufacture of a photo-voltaic converter having a PIN junction.

* * * * *